United States Patent

Gardner et al.

Patent Number: 6,054,374
Date of Patent: Apr. 25, 2000

[54] METHOD OF SCALING DIELECTRIC THICKNESS IN A SEMICONDUCTOR PROCESS WITH ION IMPLANTATION

[75] Inventors: Mark I. Gardner, Cedar Creek; H. James Fulford, Jr., Austin, both of Tex.

[73] Assignee: Advanced Micro Devices, Sunnyvale, Calif.

[21] Appl. No.: 08/979,599

[22] Filed: Nov. 26, 1997

[51] Int. Cl.[7] .................................................. H01L 21/265
[52] U.S. Cl. .......................................... 438/528; 438/766
[58] Field of Search .................................... 438/528, 514, 438/527, 536, 287, 165, 770, 702, 763, 911, 918, 920, 966, 974, FOR 158, FOR 27, FOR 93

[56] References Cited

U.S. PATENT DOCUMENTS

| | | | |
|---|---|---|---|
| 4,651,406 | 3/1987 | Shimizu . | |
| 4,716,126 | 12/1987 | Logan . | |
| 5,215,934 | 6/1993 | Tzeng | 438/960 |
| 5,270,244 | 12/1993 | Bauga | 438/966 |
| 5,330,920 | 7/1994 | Solemani et al. | 438/762 |
| 5,429,472 | 7/1995 | Anjum et al. | 438/528 |
| 5,432,114 | 7/1995 | O . | |
| 5,480,828 | 1/1996 | Hsu et al. | 438/528 |
| 5,532,181 | 7/1996 | Takebuchi et al. . | |
| 5,672,521 | 9/1997 | Barson et al. | 438/528 |
| 5,726,087 | 3/1998 | Tseng et al. | 438/261 |
| 5,814,858 | 9/1998 | Williams | 257/328 |

*Primary Examiner*—Savitri Mulpuri
*Attorney, Agent, or Firm*—Joseph P. Lally; Raman N. Dewan; Dewan & Lally, LLP.

[57] ABSTRACT

A semiconductor fabrication process including a method of controlling the gate dielectric film thickness without adjusting the oxidation recipe. A sacrificial dielectric layer is formed on an upper surface of a semiconductor substrate. An oxidation inhibiting species is then introduced into the semiconductor substrate. The sacrificial dielectric layer is then removed from the substrate and the substrate is immersed into an oxygen bearing ambient maintained at a recipe temperature for a recipe duration. Preferably, the recipe temperature is in the range of approximately 500 to 800° C. and the recipe duration is in the range of approximately 2 to 20 minutes. The final thickness of the gate dielectric film is adjusted by altering a concentration of the oxidation inhibiting species within the semiconductor substrate. Preferably, the method of altering the concentration of the oxidation inhibiting species is accomplished by adjusting the dose of an implant used to introduced the oxidation inhibiting species into the semiconductor substrate.

7 Claims, 3 Drawing Sheets

METHOD OF SCALING DIELECTRIC THICKNESS IN A SEMICONDUCTOR PROCESS WITH ION IMPLANTATION

BACKGROUND OF THE INVENTION

1. Field of the Invention

The present invention relates to the field of semiconductor fabrication and more particularly to a method of controlling and scaling the thickness of a thin dielectric film.

2. Description of the Relevant Art

The conventional fabrication of MOS (metal-oxide-semiconductor) transistors is well known in the electronics industry. Typically, a silicon substrate is divided into a plurality of active and isolation regions through an isolation process. After appropriate cleaning of the substrate surface, a thin gate oxide is then grown on an upper surface of the substrate over the active regions. Next, a plurality of polysilicon gates are formed on the gate oxide layer. Each gate traverses an active region of the substrate thereby effectively dividing the active region into a pair of regions referred to as source/drain regions. After formation of the polysilicon gates, the source/drain regions are implanted with an impurity concentration sufficient to render the source/drain regions conductive. The implantation of the source/drain regions after the formation of the polysilicon gate insures that the gate is self aligned to the source/drain regions and, consequently, to the device channel region as well.

As transistor channel lengths fall below 0.5 microns, the limitations of conventional transistor processing become more apparent. In particular, short channel effects emerge as a problem for transistors with channel lengths of less than approximately 2 microns. For devices of this size, the depletion regions around the negatively biased drain/substrate and source/substrate junctions during normal circuit operation begin to approach a size comparable to the channel length. Under these circumstances, the transistor drain current fails to saturate (i.e., the drain current is a function of drain voltage regardless of the drain voltage value), sub-threshold leakage begins to exhibit a dependence on the drain voltage, and the threshold voltages exhibits dependence on the transistor geometries and the specific biasing conditions. From experimental data, it has been observed that the onset of short channel behavior is, to a first order approximation for a given starting material under a given set of biasing conditions, a function of the junction depth and the thickness of the gate oxide. See, e.g., Sze, *Physics of Semiconductor Devices* p. 471 (Wiley & Sons 1981). Accordingly, semiconductor manufacturers constantly seeking methods of minimizing these other critical dimensions of the transistor to achieve smaller channel length devices without incurring significant short channel behavior.

The preceding discussion indicates that increasingly thin gate oxide films are required to maintain adequate performance in deep sub-micron transistors. Thin gate oxides, however, are difficult to consistently manufacture and are susceptible to reliability problems. Typically, the maximum electric field that may be sustained across an oxide film without resulting in oxide breakdown is in the vicinity of approximately 6 MV/cm. If a particular process is designed to operate with a 3.3 V gate voltage, oxide films of less than approximately 55 angstroms in thickness may be susceptible to reliability problems. This minimum oxide thickness imposes a significant restraint on transistor and, ultimately, device performance in the deep sub-micron region.

In addition to manufacturing and reliability concerns presented by thin oxides, the migration of mobile contaminants across the gate oxide film and into active regions of the device increases as oxide thickness decreases. This problem is especially acute for boron implanted gate structures typically associated with p-channel transistors because of the relatively high rate at which boron atoms tend to diffuse through an oxide film. Because boron atoms are p-type dopants in a silicon lattice, excessive boron migration into the channel region of the transistor can result in a measurable and undesirable shift in threshold voltage for p-channel transistors.

The desire to use thin gate oxides to meet performance requirements and thick oxides to address reliability concerns imposes a difficult decision on manufacturers. In some situations it might be desirable to achieve a thin oxide with respect to certain transistors while implementing other transistors with a thicker, more reliable, oxide. To achieve this, however, the solution implemented would have to impose a minimum of additional complexity to the manufacturing process.

In addition to the concerns listed above, the reliable and consistent production of oxides of less than approximately 50 angstroms in thickness is difficult to achieve. Some of the difficulty may be attributed to the large number of parameters that must be controlled to achieve a desired film thickness. Typically the interactions and dependencies that each of these parameters have on each other and on the final product are extremely complex and not fully understood. In the formation of a thin film dielectric layer, for example, the associated parameters include the orientation of the crystal lattice, the presence or absence of $H_2O$, the presence of absence of chlorine, the temperature, the pressure, the concentrations of impurities within the substrate, and a variety of other parameters. If a particular manufacturing facility desires to produce thinner oxides, a rigorous array of experiments is generally undertaken to determine which of the multiple parameters require changes and to evaluate to result of any changes made. In some circumstances, however, it would be desirable to implement a procedure whereby the final film thickness of a thin dielectric layer may be controlled with a simple set of one or two process parameters. Ideally, the parameters chosen would have little effect on the remainder of the fabrication sequence. For example, in a semiconductor process in which the redistribution of previously introduced impurity distributions is a concern, it would be ideal if a change in the thickness of a dielectric film could be implemented without affecting the time and temperature to which the impurities are subjected.

SUMMARY OF THE INVENTION

The problems identified above are in large part addressed by a semiconductor fabrication process in which the thickness of a dielectric layer formed on a semiconductor substrate is controlled through the use of an ion implantation process. By implanting a species that inhibits the formation of the dielectric film into the semiconductor substrate, the present invention contemplates controlling the thickness of a subsequently formed dielectric without adjusting the parameters of the process associated with forming the dielectric film itself.

Broadly speaking, the present invention contemplates a method of controlling the thickness of a thermally formed dielectric film without adjusting a recipe used for the formation of the dielectric film. A sacrificial dielectric layer is formed on an upper surface of the semiconductor substrate. An oxidation inhibiting species is then introduced into the semiconductor substrate. The sacrificial dielectric layer is then removed from the semiconductor substrate and the substrate is immersed into an oxygen bearing ambient maintained at a recipe temperature, preferably in the range of approximately 500 to 800° C., for a recipe duration, preferably in the range of approximately 2 to 20 minutes, to grow the gate dielectric film. In this manner, the final thickness of the gate dielectric film is adjusted by altering a concentration of the oxidation inhibiting species within the semiconductor substrate.

Preferably, the formation of the sacrificial dielectric layer is accomplished by immersing the substrate into an oxygen bearing ambient maintained at a temperature in the range of approximately 500 to 800° C. for a duration in the range of approximately 2 to 20 minutes. The final thickness of the sacrificial dielectric layer is suitably in the range of approximately 50 to 300 angstroms. Preferably, the oxidation inhibiting species comprises nitrogen in a presently preferred embodiment and in the introduction of the oxidation inhibiting species into the substrate is preferably accomplished with an ion implantation process. An implant dose for the ion implantation process is preferably in the range of approximately $1 \times 10^{13}$ atoms/cm$^2$ to $5 \times 10^{15}$ atoms/cm$^2$. An implant energy used for the ion implant process is preferably in the range of approximately 5 to 40 keV. In the preferred embodiment, a final thickness of the gate dielectric film is in the range of approximately 20 to 35 angstroms.

The present invention further contemplates a method of producing a multiple thickness gate dielectric film on the upper surface of a semiconductor substrate. A sacrificial dielectric layer is formed on the semiconductor substrate and a first concentration of an oxidation inhibiting species is introduced into a first region of the substrate. A second concentration of the oxidation inhibiting species is introduced into a second region of the substrate. The substrate is then immersed into an oxygen bearing ambient maintained at a temperature in the range of approximately 500 to 800° C. for a duration in the range of approximately 2 to 20 minutes. A first thickness of the gate dielectric film is formed over the first region and a second thickness of the gate dielectric film is formed over the second region. The first thickness and the second thickness have a ratio that is a function of the ratio of the first concentration to the second concentration.

Preferably, the formation of the sacrificial dielectric layer comprises an oxidation process performed at a temperature in the range of approximately 500 to 800° C. for a duration in the range of approximately 2 to 20 minutes. A final thickness of the dielectric layer is preferably in the range of 50 to 300 angstroms. In the preferred embodiment, the first and second concentrations within the substrate comprise nitrogen preferably introduced into the first and second regions respectively through the use of a pair of ion implantation processes. In the preferred embodiment, the implant dose used for the ion implantation process used to introduce the first and second concentrations into the substrate are in the range of approximately $1 \times 10^{13}$ to $5 \times 10^{15}$ atoms/cm$^2$. The implant energies for these ion implant processes are preferably in the range of approximately 5 to 40 keV. In one embodiment, the first region of the semiconductor substrate is p-type single crystal silicon while the second region comprises n-type single crystal silicon.

The present invention further contemplates a method for producing a multiple thickness gate dielectric film on an upper surface of a semiconductor substrate. The substrate includes a first region and a second region that is laterally displaced from the first region. A sacrificial dielectric layer is formed on an upper surface of the substrate. A first concentration of an oxidation inhibiting species is then introduced into the first region of the substrate. The sacrificial dielectric layer is then removed from the substrate and the substrate is immersed into an oxygen bearing ambient maintained at a temperature in the range of approximately 500 to 800° C. for a duration in the range of approximately 2 to 20 minutes. A first thickness of the gate dielectric film is formed over the first region and a second thickness is formed over the second region where in the first thickness is less than the second thickness. In a CMOS embodiment of the invention, the first region comprises p-type silicon and the second region comprises n-type silicon.

BRIEF DESCRIPTION OF THE DRAWINGS

Other objects and advantages of the invention will become apparent upon reading the following detailed description and upon reference to the accompanying drawings in which.

Figure 1:
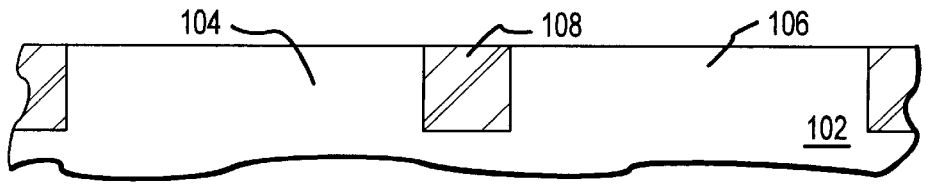
FIG. 1 is a partial cross sectional view of a semiconductor substrate including a first region laterally displaced from a second region by an intermediate isolation structure.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIGS. 1 through 8 showed a preferred processing sequence of one embodiment of the present invention in which a multiple thickness gate dielectric film is formed by selectively introducing varying doses of an oxidation inhibiting species into selected regions of a semiconductor substrate prior to a thermal oxidation step. The present invention contemplates controlling the thickness produced by given thermal oxidation process by varying the concentration of an oxidation inhibiting species within the semiconductor substrate. Controlling the thickness of a gate dielectric film by varying the parameters of an implant step enables a process sequence to achieve extremely thin (i.e. less than approximately 35 angstrom) film thicknesses in a repeatable fashion.

In addition, controlling a film thickness by varying the parameters of an implant step allows optimization and standardization of the thermal oxidation process. Optimizing and standardizing the thermal oxidation process eliminates manufacturing complexities associated with varying the thermal oxidation process to achieve a desire film thickness. Adjusting the time, temperature, and other parameters of the thermal oxidation process used to form the gate dielectric film may introduce, for example, variations in the distributions of impurity concentrations introduced into the substrate prior to the thermal oxidation process.

In a CMOS process, for example, multiple ion implantation processes precede the thermal oxidation step. Each of these ion implantation steps are design to achieve a desired impurity concentration within the respective regions (p-channel and n-channel) of the substrate. It is desirable to standardize the time and temperature to which each of the implanted impurity distributions is subjected so that the final distributions of the implanted species may be accurately predicted. Accordingly, the present invention offers the semiconductor manufacturer a method of controlling dielectric film thickness without alternating the time and temperature of the thermal process used to form the dielectric film.

In addition, the use of nitrogen as the oxidation inhibiting species in the preferred embodiment beneficially introduces a barrier species into the gate dielectric and channel regions of the transistors. The presence of a barrier impurity beneficially reduces the migrations of mobile impurities within the integrated circuit across, the gate dielectric and into the channel regions of the transistors potentially resulting in a shift in threshold voltage and other undesirable effects.

Turning now to FIG. 1, a semiconductor substrate 102 is shown as including a first region 104 laterally displaced from a second region 106. In the presently preferred embodiment, semiconductor substrate 102 comprises a single crystal silicon wafer as is well known in the industry. In an embodiment useful in the fabrication of CMOS integrated circuits, semiconductor substrate 102 includes a p-type epitaxial layer formed over a p+ silicon bulk. (In the partial cross-sectional view of FIG. 1, only the epitaxial portion of substrate 102 is shown). A resistivity of the p-type epitaxial layer in this embodiment is preferably in the range of 10 to 15 Ω/cm. In the preferred embodiment, the first region 104 is isolated from the second region 106 with an intermediate isolation structure 108. In the embodiment shown in FIG. 1, the isolation structure 108 is of the shallow trench isolation variety. In shallow trench isolation structures such as isolation structure 108, a trench is etched into the substrate 102 and subsequently filled with a dielectric such as a chemically vapor deposited silicon dioxide. A planarization process is suitably performed after the deposition process to produce a substantially planar surface upon witch the subsequent processing may more easily proceed. Those familiar with semiconductor isolation techniques will appreciate that alternative isolation structures may be substituted for the shallow trench isolation structures shown in FIG. 1. In one alternative embodiment, for example, LOCOS isolation structures may be used in lieu of shallow trench isolation structures. LOCOS isolation is achieved by selectively oxidizing the isolation regions of a semiconductor substrate. Typically, the selective oxidation of the substrate is accomplished by pattering a silicon nitride film over the active regions (i.e. the regions into which transistors will subsequently be formed) of the substrate.

In one embodiment of the present invention, first region 104 of semiconductor substrate 102 represents the n-channel region of a CMOS integrated circuit while second region 106 of substrate 102 represents the p-channel region. In other embodiments, the first and second regions 104 and 106 may either both be p-channel or both be n-channel regions of substrate 102. In such an embodiment, the present invention contemplates the formation, for example, of a device which has more than one gate dielectric thickness for its n-channel or p-channel (or both) devices.

Figure 2:
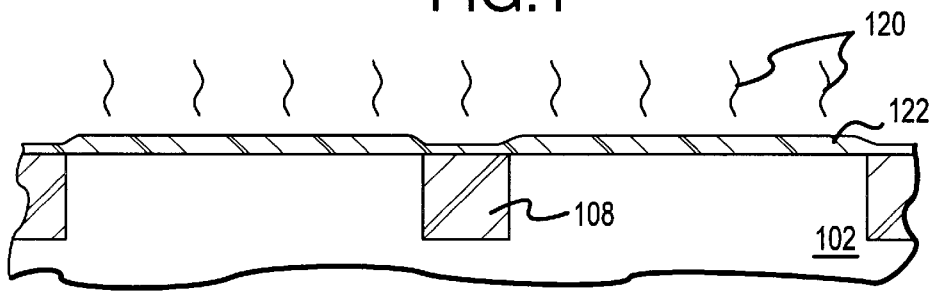
FIG. 2 is a processing step subsequent to FIG. 1 in which a sacrificial dielectric film is thermally formed on an upper surface of the substrate.

Turning now to FIG. 2, a sacrificial dielectric film 122 is formed upon an upper surface of substrate 102. In a presently preferred embodiment, the formation of sacrificial dielectric film 122 is achieved with a thermal oxidation process represented in FIG. 2 by reference numeral 122. In the preferred embodiment, thermal oxidation process 120 comprises immersing semiconductor substrate 102 into an oxygen bearing ambient maintained at a temperature in the range of approximately 500 to 800° C. for a duration in the range of approximately 2 to 20 minutes. Accordingly, the preferred sacrificial dielectric film comprises a thermally formed silicon dioxide film. The sacrificial dielectric film 122 beneficially provides a pad mask for a subsequent implant such that the damage to the substrate 102 caused by the implant is minimized. Additionally, the sacrificial formation of dielectric film 122, by thermally consuming an upper portion of semiconductor substrate 102, results in a cleaner upper surface of substrate 102 after the removal of the sacrificial film. In the preferred embodiment, a thickness of the gate dielectric film is in the range of approximately 50 to 300 angstroms.

Figure 3:
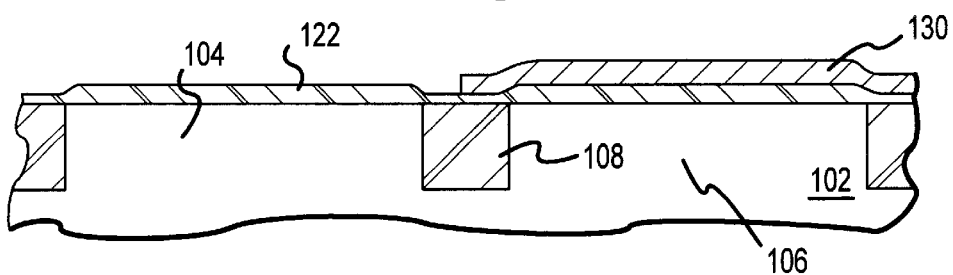
FIG. 3 is a processing step subsequent to FIG. 2 in which a photoresist pattern is formed over a second region of the semiconductor substrate.

Turning now to FIG. 3, an embodiment of the present invention is shown in which a photo mask 130 is formed over second region 106 of semiconductor substrate 102. The formation of a photo mask 130 is accomplished in a conventional fashion using standard photoresist and photo mask techniques. The presence of photo mask of 130 over second region 106 enables selective introductions of varying concentrations of an oxidation inhibiting species into desired regions of the substrate 102 to achieve multiple dielectric film thicknesses during a subsequently performed thermal oxidation process.

Figure 4:
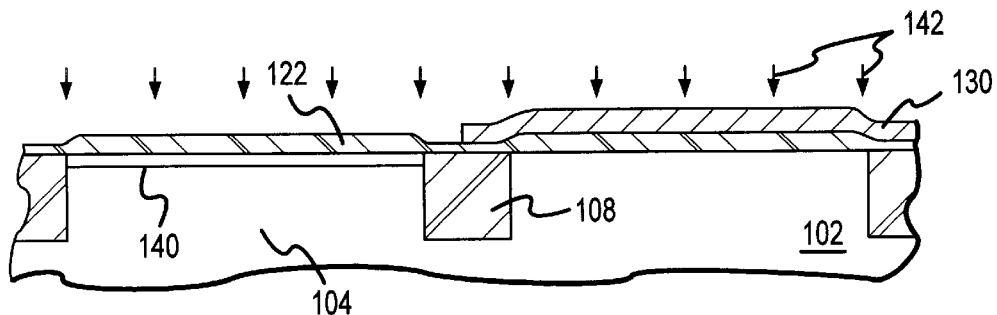
FIG. 4 is a processing step subsequent to FIG. 3 in which a first concentration of an oxidation inhibiting species is introduced into the first region of the substrate.

Turning now to FIG. 4, a first concentration 140 of an oxidation inhibiting species is introduced into first region 104 of substrate 102. In the preferred embodiment, the introduction of first concentration 140 into semiconductor substrate 102 is achieved with an ion implantation process represented in FIG. 4 by reference numeral 142. In one presently preferred embodiment, a suitable oxidation inhibiting species used for ion implantation process 142 comprises nitrogen preferably in the form of $N_2$. Is believed that the incorporation of a nitrogen impurity concentration into the silicon lattice of the typical semiconductor substrate reduces the oxidation rate of the substrate by decreasing the rate at which oxygen atoms can migrate to the substrate-oxide interface to participate in additional oxidation. In addition, nitrogen serves as an excellent barrier to the migration of many known mobile contaminants such as boron and sodium. In the presently preferred embodiment, the ion implantation process 142 is preferably performed using an implant dose in the range of approximately $1 \times 10^{13}$ atoms/cm$^2$ to 5×10$^{15}$ atoms/cm$^2$ using an implant energy in the range of approximately 5 to 40 keV.

Figure 5:
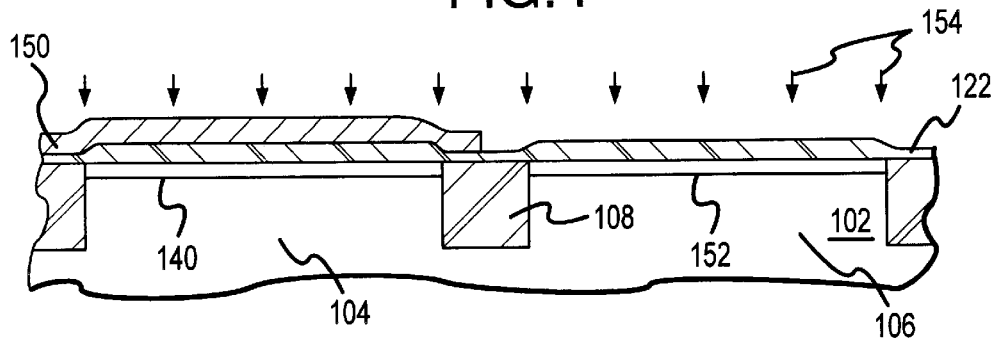
FIG. 5 is a processing step subsequent to FIG. 4 in which a second concentration of an oxidation inhibiting species is introduced into the second region of the semiconductor substrate through the use of a photoresist mask formed over the first region.

Turning now to FIG. 5 an optional processing step in one embodiment in the present invention is shown in which a second concentration 152 of an oxidation inhibiting species is introduced into a second region 106 of semiconductor substrate 102. In this embodiment, the photo mask 130 of FIG. 4 has been removed and a new mask 150 has been fabricated to prevent the second concentration 152 from entering first region 104 of semiconductor substrate 102. It will be appreciated to those familiar with ion implantation processes and impurity concentrations that, if second concentration 152 of the oxidation inhibiting species is significantly less (i.e. less than approximately 10 times) the concentration of first concentration of 140, the second ion implantation process 154 may be suitable performed without the presence of a photo mask such as photo mask 150. In other words, if the second ion implantation process 154 will not significantly alter the first concentration 140, ion implantation 154 may be blanket introduced into substrate 102 thereby beneficially eliminating an additional photolithography step. It is to be understood, that in other embodiments of the present invention, the second ion implantation step 154 may be eliminated entirely resulting in a second region 106 that includes no oxidation inhibiting species concentration.

Figure 6:
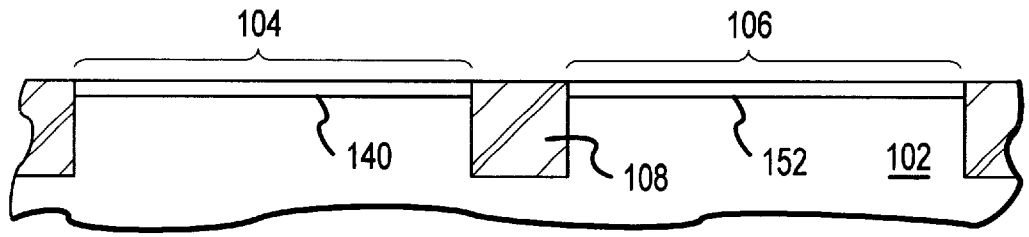
FIG. 6 is a processing step subsequent to FIG. 5 in which the sacrificial dielectric film has been removed from the substrate.

Turning now to FIG. 6, the sacrificial dielectric film 122 is removed from substrate 102. In the preferred embodiment, the removal of the sacrificial dielectric film 122 is accomplished by dipping substrate 102 into a 10:1 HF solution. After the removal of the sacrificial dielectric film 122, the upper surface of substrate 102 is prepared for the thermal oxide process with a cleaning sequence that typically includes the well known RCA clean. In a RCA clean, substrate 102 is immersed in a first solution comprising $H_2O$—$Na_4OH$—$H_2O_2$ and thereafter immersed into a second solution including $H_2O$—HCl—$H_2O_2$ to produce a pristine surface upon which a high quality dielectric layer film may be thermally formed.

Figure 7:
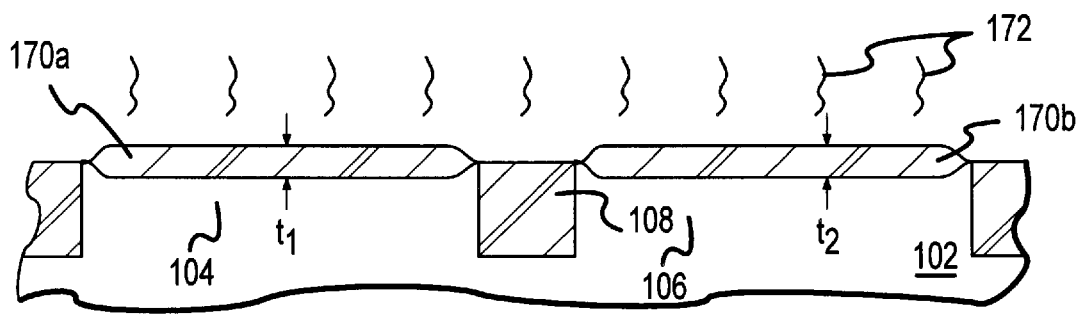
FIG. 7 is a processing step subsequent to FIG. 6 in which a duel thickness of a gate dielectric film is formed over the semiconductor substrate.

Turning now to FIG. 7, a gate dielectric film 170 (shown in FIG. 7 as comprising gate dielectric film 170a and 170b). Because of the presence of the first and second concentrations 140 and 152 respectively of the oxidation inhibiting species within first and second regions first and second regions 104 and 106 respectively of substrate 102, the portion 170a of gate dielectric film 170 over first region 104 of substrate 102 has a first thickness $t_1$ whereas the second portion 170b of gate dielectric film 170 over second region 106 of substrate 102 has a second thickness $t_2$. The thermal oxidation process 172 used to produce dielectric film 170 is achieved by immersing substrate 102 into an oxygen bearing ambient maintained at a temperature in the range of approximately 500 to 800° C. for a duration in the range of approximately 2 to 20 minutes. In the preferred embodiment, first thickness $t_1$ and second thickness $t_2$ are both in the range of approximately 20 to 35 angstroms. In an embodiment in which the first concentration 140 within the first region 104 of substrate 102 is greater than second concentration 152, it will be appreciated that the first thickness $t_1$ is less than the second thickness $t_2$ due to the more significant reduction of oxidation rate within the first region 104. In one embodiment, the second region 106 comprises the p-channel region of semiconductor substrate 102. In this embodiment, the greater thickness $t_2$ of the second portion 170b of dielectric film 170 over the p-channel region 106 beneficially reduces the probability of boron penetrating the gate dielectric film and locating within the underlying active or channel region of the transistor. In this embodiment, the thinner thickness $t_1$ of first portion of 170a of dielectric film 170 is desirable to achieve a higher drain current IDS within the n-channel regions 104 of substrate 102. In another embodiment, first region 104 and second region 106 may both comprise either n-channel or p-channel regions and the selective use of varying oxide thicknesses will be desirable to achieve a thicker gate dielectric for selective transistors within the integrated circuit known to require a higher level of reliability. If, for example, particular transistors within the n-channel region are subjective to significantly higher drain current, it may be desirable to increase the oxide thickness of these transistors. In any event, the control of the oxide thicknesses within the various regions of the semiconductor substrate is achieved by controlling the preceding ion implantation such that a single thermal oxidation step results in varying oxide thicknesses depending upon the location of substrate 102. It is noted that, while the Figs. depict two ion implantation steps, additional implants may be performed, in conjunction with additional photolithography steps to achieve three or more film thicknesses.

Figure 8:
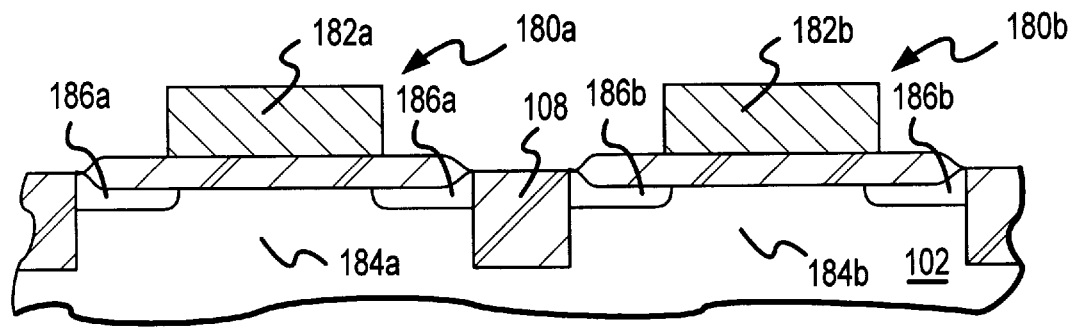
FIG. 8 is a processing step subsequent to FIG. 7 in which transistors are formed in the first and second regions of the semiconductor substrate.

Turning now to FIG. 8, transistors 180a and 180b are shown. The fabrication of transistor such as transistor 180a and 180b is carried out in an conventional fashion by patterning a conductive gate structure 182 over a channel region 184 of the appropriate transistor. In the preferred embodiment, the conductive gate structure 182 comprises chemically vapor deposited polysilicon typically doped with an impurity such as boron, phosphorus, or arsenic to reduce a sheet resistivity of the conductive gate structure to less than approximately 50 Ω/square. In other embodiments, the conductive gate structure 182 may comprise aluminum, copper, tungsten, or other suitable conductive material. After the formation of the conductive gate structures using a conventional photolithography/etch sequence, the source/drain regions 186a and 186b are introduced into substrate 102 with an ion implantation process. The source/drain impurity distributions 186a and 186b typically comprise phosphorus, arsenic, or boron depending upon the conductivity type of the particular transistor.

Figure 9:
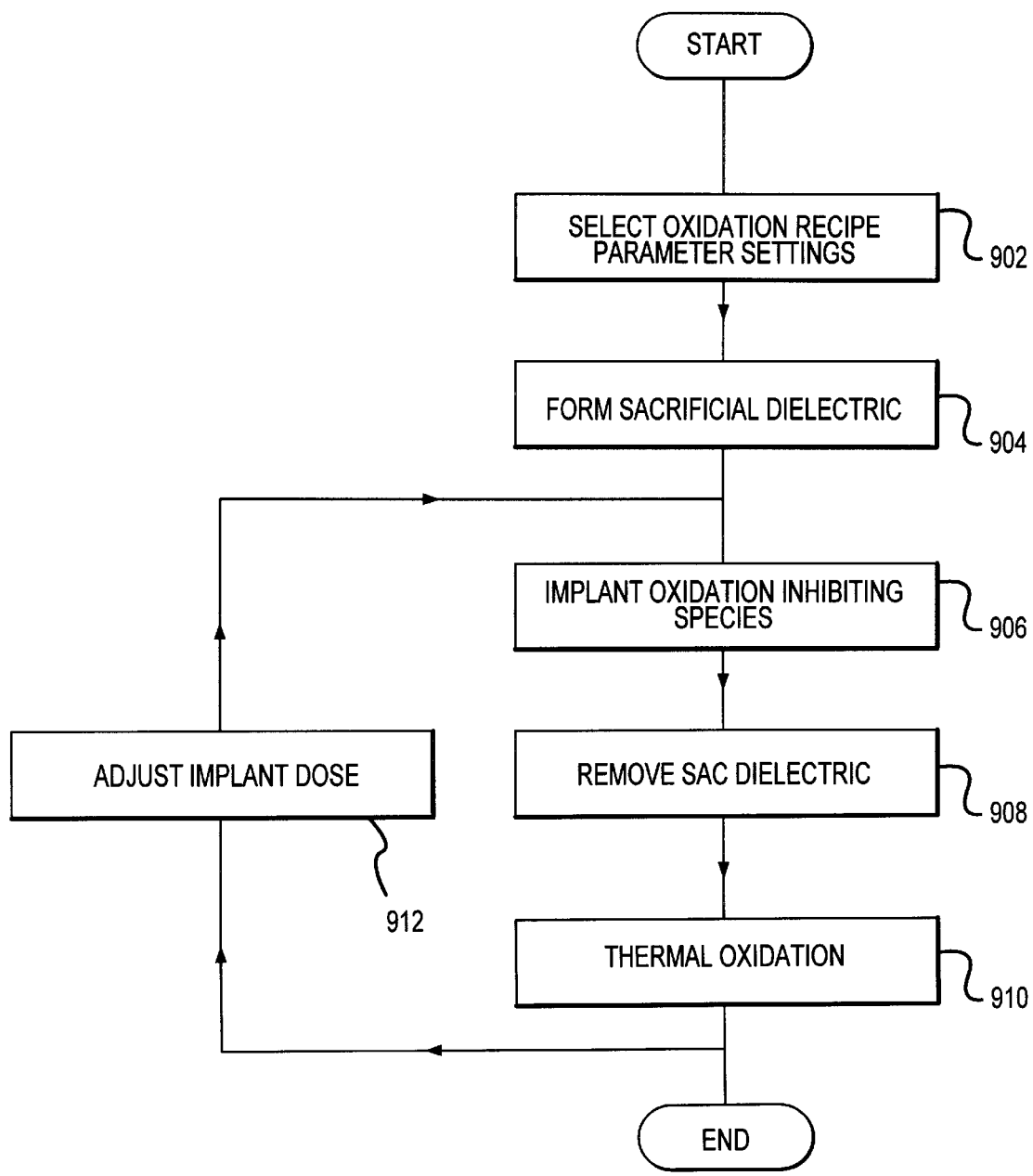
FIG. 9 is a flow diagram of a method for controlling the thickness of a dielectric film.

Turning now to the flow diagram of FIG. 9, a method of controlling the thickness of a thermally formed dielectric film without adjusting the oxidation recipe used for the formation of the dielectric film as shown. Initially, in step 902 the oxidation recipe parameters settings are chosen. The oxidation recipe parameters include the temperature of the oxidation ambient, the duration of the oxidation cycle, as well as the pressure and composition of the oxidizing ambient. One presently preferred embodiment employs a dry oxidation at a temperature in the range of approximately 500 to 800° C. and a pressure of less than approximately 20 atm, possibly in the presence of a chlorine containing species such as HCl, TCE, or TCA. The large number of variables associated with an oxidation recipe make it advisable to operate with fixed parameter settings to avoid unintended oxide thickness variations caused by adjusting one of the oxidation parameters. After the oxidation recipe has been determined, a sacrificial dielectric layer is formed in step 904 as described previously with respect to FIG. 2. An oxidation inhibiting species is then implanted into the semiconductor substrate in step 906 possibly in the presence of a photoresist mask formed on the semiconductor substrate as described with respect to FIG. 3. In step 908, the sacrificial dielectric layer (and any photoresist) are removed from the semiconductor substrate and the substrate upper surface is prepared for the gate oxidation cycle using the cleaning procedures describe with respect to FIG. 6. In step 910, the thermal oxidation of the substrate is carried out using the oxidation recipe parameter settings selected in step 902. The thickness of the oxide obtained using this thermal oxidation process may then be associated with the implant dose used in implant step 906. In step 912, the implant dose is adjusted and the process is repeated for a subsequent set of semiconductor substrates. Using a number of implant doses on a series of wafer results in the creation of an association between various implant doses and various final oxide thicknesses such that the desired oxide thickness may be obtained by adjusting the implant dose without adjusting any of the parameters associated with the oxidation recipe. This method of controlling oxide thickness in a semiconductor process has the advantage of simplifying and reducing the number of parameters that must be adjusted to achieve a desire oxide thickness. In addition, a variety of oxide thicknesses may be produced wherein each of the substrates is subjected to the same time and temperature during the gate oxidation process. In other words, the thermal budget consumed by the gate oxidation step remains constant and independent of the gate oxide thickness.

It will be appreciated to those skilled in the art that the present invention is capable of producing integrated circuits that have multiple gate oxide thicknesses using a single gate oxidation step. In addition, the present invention contemplates a method of controlling the gate oxide thickness without adjusting the parameters conventionally associated with the gate oxidation recipe. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. A method of producing a multiple thickness gate dielectric film on an upper surface of a semiconductor substrate, said method comprising:

forming a sacrificial dielectric layer on an upper surface of said semiconductor substrate;

ion implanting a first concentration of an oxidation inhibiting species into a first region of said semiconductor substrate;

blanket implanting a second concentration of said oxidation inhibiting species into said semiconductor substrate wherein an implant dose used for implanting said first concentration exceeds an implant dose used for said second concentration by a factor of ten, and wherein said first region of said semiconductor substrate includes said first and second concentrations of said oxidation inhibiting species and further wherein a second region of said semiconductor substrate includes said second concentration;

immersing said semiconductor substrate into an oxygen bearing ambient maintained at a temperature in the range of approximately 500 to 800° C. for a duration in the range of approximately 2 to 20 minutes, wherein a first thickness of said gate dielectric film is formed over said first region and a second thickness of said gate dielectric film is formed over said second region.

2. The method of claim 1, wherein the step of forming said sacrificial dielectric layer comprises immersing said semiconductor substrate in an oxygen bearing ambient maintained at a temperature in the range of approximately 500 to 800° C. for a duration in the range of approximately 2 to 20 minutes.

3. The method of claim 1, wherein a final thickness of said sacrificial dielectric layer is in the range of approximately 50 to 300 angstroms.

4. The method of claim 1, wherein said first and second concentrations comprise nitrogen.

5. The method of claim 1, wherein an implant species for said ion implanting comprises nitrogen.

6. The method of claim 5, wherein implant doses for said ion implanting of said first and second regions are in the range of approximately $1 \times 10^{13}$ atoms/cm$^2$ to $5 \times 10^{15}$ atoms/cm$^2$.

7. The method of claim 1, wherein said first region of said semiconductor substrate comprises p-type single crystal silicon and said second region of said semiconductor substrate comprises n-type single crystal silicon.

* * * * *